US012609706B1

(12) United States Patent (10) Patent No.: US 12,609,706 B1
Ma et al. (45) Date of Patent: Apr. 21, 2026

(54) PHASE LOCKED LOOP ARCHITECTURE WITH REDUCED BANDWIDTH VARIATION

(71) Applicant: Cadence Design Systems, Inc., San Jose, CA (US)

(72) Inventors: Shaojun Ma, San Jose, CA (US); Didem Zeliha Turker Melek, San Jose, CA (US); Stephen Thomas Williams, Woodbine, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 86 days.

(21) Appl. No.: 18/607,940

(22) Filed: Mar. 18, 2024

(51) Int. Cl.
 *H03L 7/089* (2006.01)
 *H03L 7/099* (2006.01)
(52) U.S. Cl.
 CPC .......... *H03L 7/0891* (2013.01); *H03L 7/0991* (2013.01)
(58) Field of Classification Search
 CPC ..... H03L 7/093; H03L 7/099; H03L 2207/50; H03L 2207/06; H03L 7/087; H03L 7/085; H03L 2207/00
 See application file for complete search history.

(56) References Cited

U.S. PATENT DOCUMENTS

| | | | |
|---|---|---|---|
| 7,002,418 B2 * | 2/2006 | Zhu ........................ | H03L 7/0893 327/12 |
| 7,095,287 B2 * | 8/2006 | Maxim ................. | H03L 7/0898 331/25 |
| 9,158,320 B1 * | 10/2015 | Shrivastava ............ | G05F 1/468 |

* cited by examiner

*Primary Examiner* — Diana J. Cheng
(74) *Attorney, Agent, or Firm* — Mark H. Whittenberger; Holland & Knight LLP

(57) ABSTRACT

Embodiments included herein are directed towards a phase-locked loop (PLL) circuit. Embodiments may include a phase frequency detector circuit configured to receive an input signal. Embodiments may further include a charge pump circuit configured to receive an output signal from the phase frequency detector circuit. The charge pump circuit may source or sink charge for a controlled amount of time based upon, at least in part, the output signal from the phase frequency detector circuit. The charge pump circuit may generate a current based upon, at least in part, a bandgap voltage, a switched capacitor resistor, and a frequency reference source. Embodiments may include a loop filter circuit configured to receive the current from the charge pump circuit and a voltage-controlled oscillator circuit configured to receive the current from the charge pump circuit. Embodiments may further include a feedback divider circuit operatively connected with the voltage-controlled oscillator circuit.

18 Claims, 14 Drawing Sheets

800

100

Figure 5:
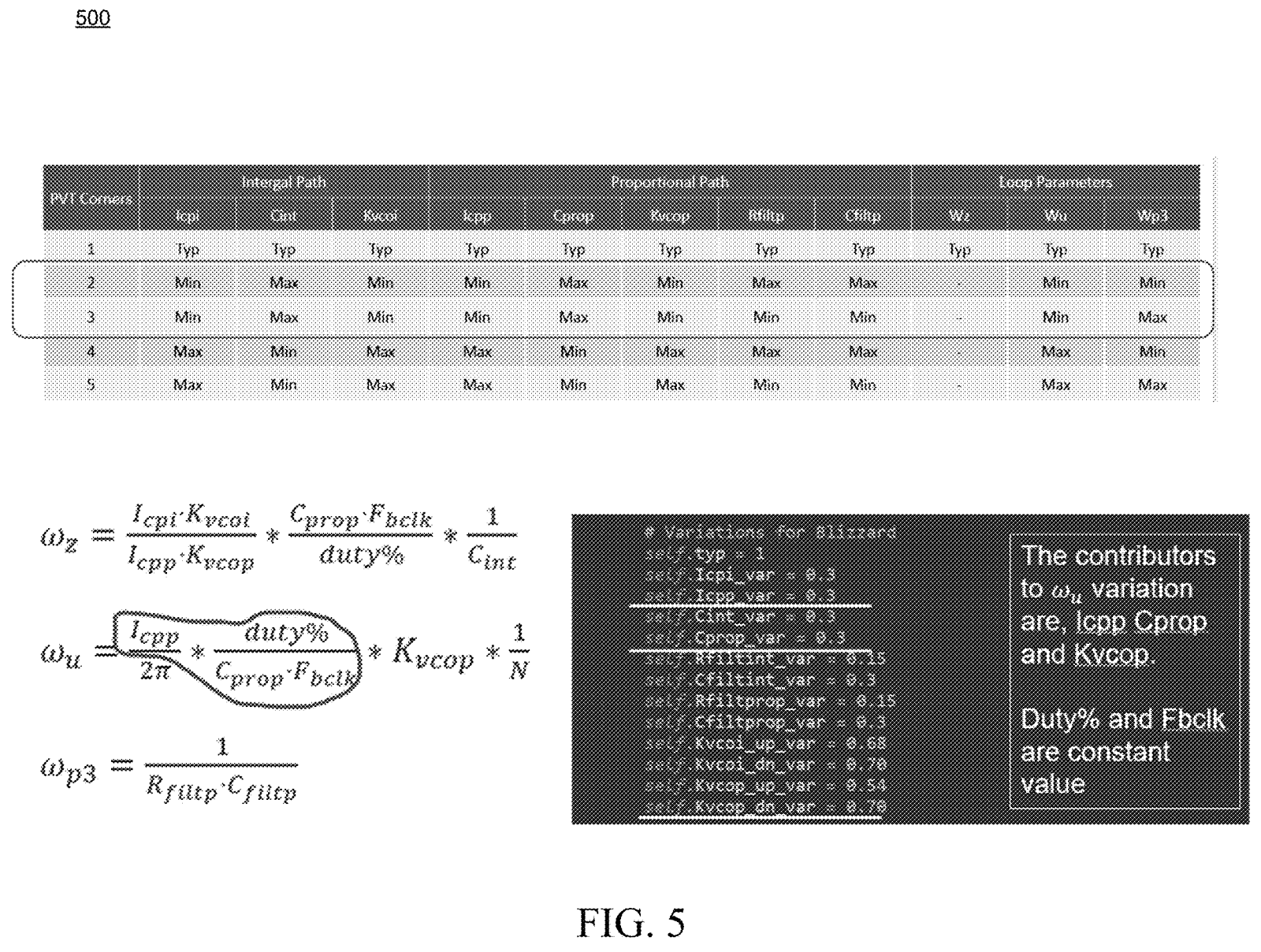

500

| PVT Corners | Integral Path | | | Proportional Path | | | | Loop Parameters | | |
|---|---|---|---|---|---|---|---|---|---|---|---|
| | Icpi | Kvcoi | Cint | Rzero | Icpp | Kvcop | Cprop | Rfltp | Cfltp | ωz | ωu | ωp3 |
| 1 | Typ | Typ | Typ | Typ | Typ | Typ | Typ | Typ | Typ | Typ | Typ | Typ |
| 2 | Min | Max | Max | Min | Max | Min | Max | Min | Min | Min | Min | Min |
| 3 | Min | Max | Max | Min | Max | Min | Min | Min | Min | Min | Max | Max |
| 4 | Max | Min | Min | Max | Min | Max | Max | Max | Max | Max | Min | Min |
| 5 | Max | Min | Min | Max | Min | Max | Min | Max | Max | Max | Max | Max |

$$\omega_z = \frac{Icpi \cdot Kvcoi}{Icpp \cdot Kvcop} * \frac{Cprop \cdot Fbclk}{duty\%} * \frac{1}{C_{int}}$$

$$\omega_u = \frac{Icpp}{2\pi} * \frac{duty\%}{Cprop \cdot Fbclk} * K_{vcop} * \frac{1}{N}$$

$$\omega_{p3} = \frac{1}{R_{fltp} \cdot C_{fltp}}$$

The contributors to $\omega_u$ variation are, Icpp Cprop and Kvcop.

Duty% and Fbclk are constant value

| PVT Corners | Intergal Path | | | Proportional Path | | | | | Loop Parameters | | |
|---|---|---|---|---|---|---|---|---|---|---|---|
| | Icpi | Cint | Kvcoi | Icpp | Cprop | Kvcop | Rfiltp | Cfiltp | Wz | Wn | Wp3 |
| 1 | Typ | Typ | Typ | Typ | Typ | Typ | Typ | Typ | Typ | Typ | Typ |
| 2 | - | Max | Min | - | Max | Min | Max | Max | - | Min | Min |
| 3 | - | Min | Min | - | Min | Min | Min | Min | - | Min | Max |
| 4 | - | Max | Max | - | Max | Max | Max | Max | Max | Max | Min |
| 5 | - | Min | Max | - | Min | Max | Min | Min | Max | Max | Max |

| Parameter | Conventional | PVT variation |
|---|---|---|
| $I_{ps}$ | $\dfrac{V_{ref}}{R_{ref}}$ | |
| $R_1$ | $R_1$ | |
| $\omega_z$ | $\dfrac{1}{R_1 C_1}$ | $\dfrac{1}{R_1(1+\Delta R_1)C_1(1+\Delta C_1)}$ |
| $\omega_{ps}$ | $\dfrac{I_{ps}}{2\pi}\cdot\dfrac{K_{Mp}R_1}{N}=\dfrac{V_{ref}}{R_{ref}}\cdot\dfrac{K_{MP}R_1}{2\pi N}$ | $\dfrac{V_{ref}}{R_{ref}(1+\Delta R_{ref})}\cdot\dfrac{K_{MP}(1+\Delta K_{MP})\cdot R_1(1+\Delta R_1)}{2\pi N}$ |
| $\omega_{p3}$ | $\dfrac{(C_1+C_2)}{R_1 C_1 C_2}\approx\dfrac{1}{R_1 C_2}$ | $\dfrac{1}{R_1(1+\Delta R_1)C_2(1+\Delta C_2)}$ |

Figure 11:
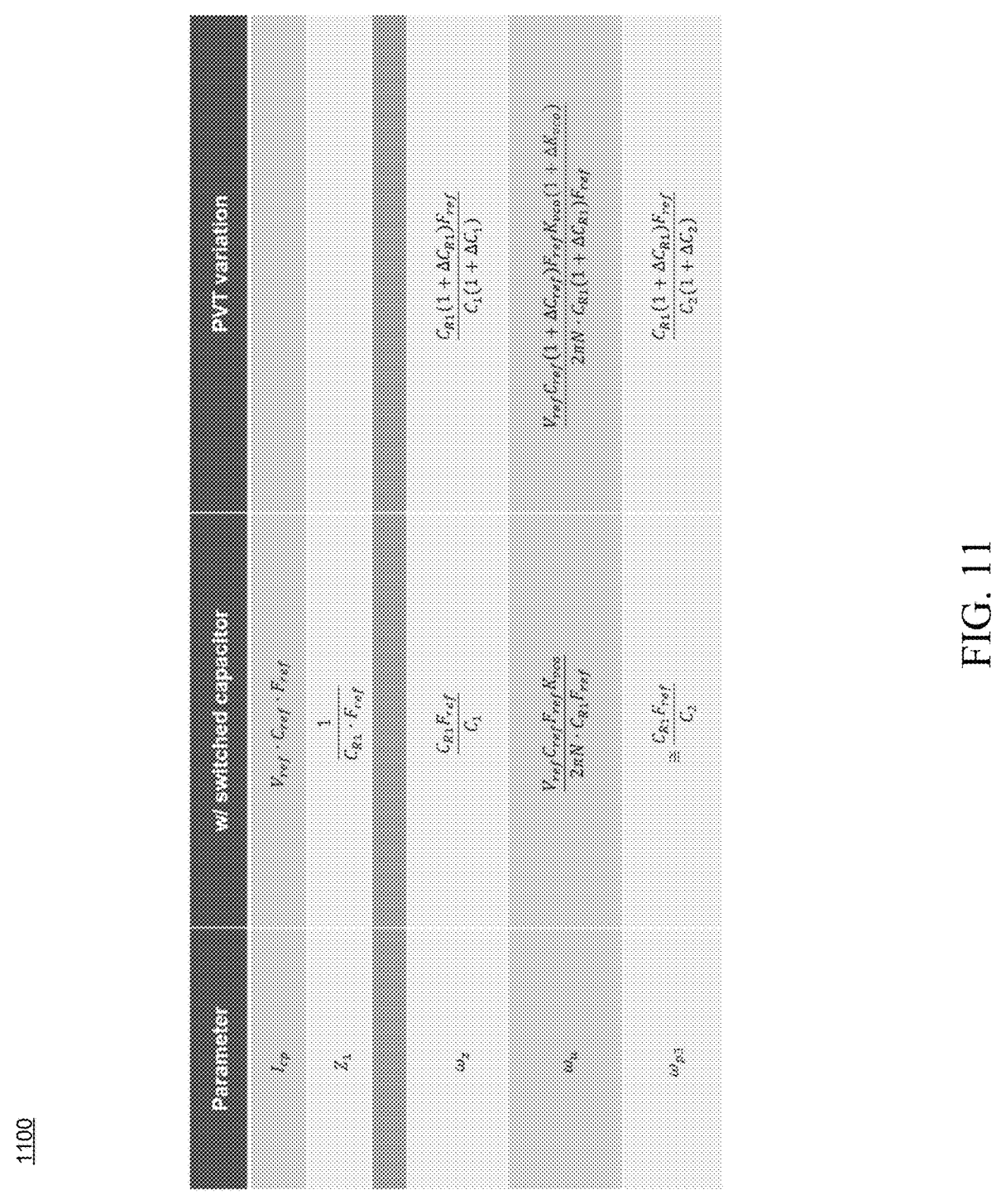

| Parameter | w/ switched capacitor | PVT variation |
|---|---|---|
| $I_{CR}$ | $V_{ref} C_{ref} F_{ref}$ | |
| $Z_A$ | $\dfrac{1}{C_{R2} \cdot F_{ref}}$ | |
| $\omega_{z1}$ | $\dfrac{C_{R2} F_{ref}}{C_3}$ | $\dfrac{C_{R1}(1 + \Delta C_{R1}) F_{ref}}{C_3(1 + \Delta C_3)}$ |
| $\omega_u$ | $\dfrac{V_{ref} C_{ref} F_{ref} K_{vco}}{2\pi N \cdot C_{R1} F_{ref}}$ | $\dfrac{V_{ref} F_{ref}(1 + \Delta C_{ref}) F_{ref} K_{vco}(1 + \Delta K_{vco})}{2\pi N \cdot C_{R1}(1 + \Delta C_{R1}) F_{ref}}$ |
| $\omega_{p1}$ | $\cong \dfrac{C_{R1} F_{ref}}{C_2}$ | $\dfrac{C_{R1}(1 + \Delta C_{R1}) F_{ref}}{C_2(1 + \Delta C_2)}$ |

| Parameter | Conventional | PVT variation |
|---|---|---|

| Parameter | w/ switched capacitor | PVT variation |
|---|---|---|
| $t_{zp}$ | $V_{ref} \cdot C_{out} \cdot F_{ref}$ | $V_{ref} \cdot C_{out} \cdot F_{ref}$ |
| $Z_1$ | $\dfrac{1}{C_{prop} \cdot F_{ref}}$ | $\dfrac{1}{C_{prop}(1+\Delta C_{prop}) \cdot F_{ref}}$ |
| $\omega_z$ | $\dfrac{I_{gm} \cdot K_{buck} \cdot C_{prop} \cdot F_{buck}}{I_{opp} \cdot K_{prop}} \cdot duty\% \cdot \dfrac{1}{C_{int}}$ | $\dfrac{I_{zp}(1+\Delta I_{zp}) \cdot K_{out}(1+\Delta K_{out})}{I_{opp}(1+\Delta I_{opp}) \cdot K_{prop}(1+\Delta K_{prop})} \cdot \dfrac{C_{prop}(1+\Delta C_{prop}) \cdot F_{buck}}{duty\%} \times \dfrac{1}{C_{int}(1+\Delta C_{int})}$ |
| $\omega_p$ | $\dfrac{V_{ref} \cdot C_{o} \cdot F_{buck}}{2\pi} \cdot \dfrac{duty\%}{C_{prop} \cdot F_{buck}} \cdot K_{prop} \cdot \dfrac{1}{N}$ | $\dfrac{V_{ref} \cdot C_o(1+\Delta C_o) \cdot F_{buck}}{2\pi} \cdot \dfrac{duty\%}{C_{prop}(1+\Delta C_{prop}) \cdot F_{buck}} \cdot K_{prop}(1+\Delta K_{prop}) \cdot \dfrac{1}{N}$ |
| $\omega_{p1}$ | $\dfrac{1}{C_{pump}/C_{buffer} f_{buck}}$ | $\dfrac{C_{buffer}(1+\Delta C_{buffer}) f_{buck}}{C_{pump}(1+\Delta C_{pump})}$ |

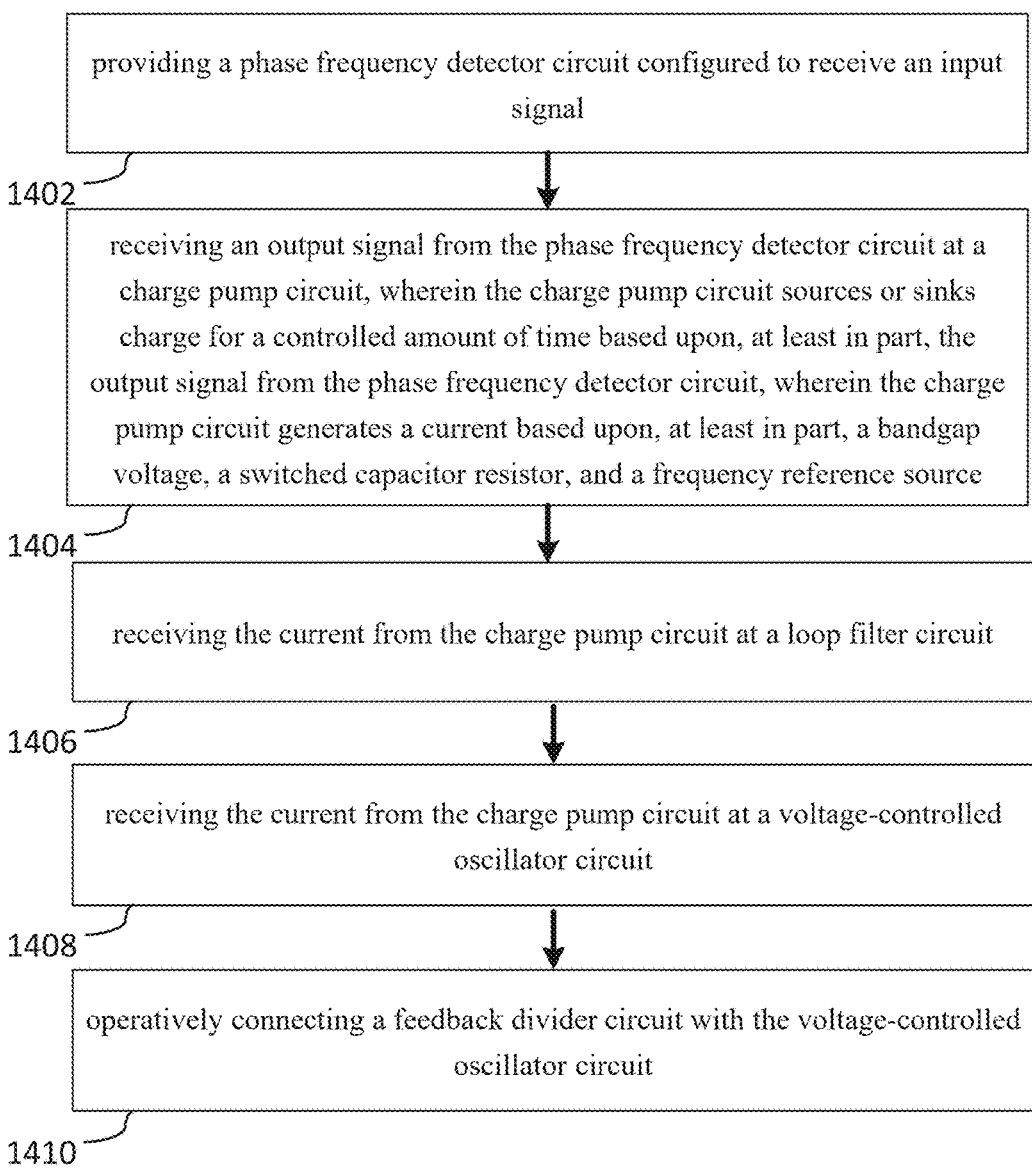

providing a phase frequency detector circuit configured to receive an input signal

1402 receiving an output signal from the phase frequency detector circuit at a charge pump circuit, wherein the charge pump circuit sources or sinks charge for a controlled amount of time based upon, at least in part, the output signal from the phase frequency detector circuit, wherein the charge pump circuit generates a current based upon, at least in part, a bandgap voltage, a switched capacitor resistor, and a frequency reference source

1404 receiving the current from the charge pump circuit at a loop filter circuit

1406 receiving the current from the charge pump circuit at a voltage-controlled oscillator circuit

1408 operatively connecting a feedback divider circuit with the voltage-controlled oscillator circuit

PHASE LOCKED LOOP ARCHITECTURE WITH REDUCED BANDWIDTH VARIATION

BACKGROUND

A frequency synthesizer is an apparatus that generates an output signal having a frequency that is an exact multiple of a reference frequency. The accuracy of the output signal frequency is typically determined by the accuracy and stability of the reference frequency source.

A common type of frequency synthesizer uses a phase-locked loop (PLL) to provide an output signal having a selectable, precise, and stable frequency. The PLL includes a phase detector, a voltage-controlled oscillator (VCO), and a feedback path arranged in a way that the phase of the VCO output is forced to be synchronous with the phase of the input reference frequency.

SUMMARY

In one or more embodiments of the present disclosure, a phase-locked loop (PLL) circuit is provided. The circuit may include a phase frequency detector circuit configured to receive an input signal. The circuit may further include a charge pump circuit configured to receive an output signal from the phase frequency detector circuit. The charge pump circuit may source or sink charge for a controlled amount of time based upon, at least in part, the output signal from the phase frequency detector circuit. The charge pump circuit may generate a current based upon, at least in part, a bandgap voltage, a switched capacitor resistor, and a frequency reference source. The circuit may include a loop filter circuit configured to receive the current from the charge pump circuit and a voltage-controlled oscillator circuit configured to receive the current from the charge pump circuit. The circuit may further include a feedback divider circuit operatively connected with the voltage-controlled oscillator circuit.

One or more of the following features may be included. In some embodiments, the phase-locked loop circuit may include a dual-path PLL having an integral path and a proportional path. The phase-locked loop circuit may include a single-path PLL. The loop filter circuit may be configured to suppress high-frequency components and transform a phase frequency detector output into the control signal. The voltage-controlled oscillator circuit may use an external voltage to influence its frequency of operation. The feedback divider circuit may divide a voltage-controlled oscillator frequency and generate a feedback signal to the phase frequency detector circuit. The feedback signal may include a waveform having a frequency lower than that of a voltage-controlled oscillator circuit output signal. The switched capacitor resistor may be located in the proportional path. The circuit may include an RC filter circuit operatively connected with the switched capacitor resistor in the proportional path. The circuit may further include a complementary switched capacitor resistor in electrical communication with the switched capacitor resistor.

In one or more embodiments of the present disclosure a phase-locked loop (PLL) method is provided. The method may include providing a phase frequency detector circuit configured to receive an input signal and receiving an output signal from the phase frequency detector circuit at a charge pump circuit. The charge pump circuit may source or sink charge for a controlled amount of time based upon, at least in part, the output signal from the phase frequency detector circuit. The charge pump circuit may generate a current based upon, at least in part, a bandgap voltage, a switched capacitor resistor, and a frequency reference source. The method may further include receiving the current from the charge pump circuit at a loop filter circuit and receiving the current from the charge pump circuit at a voltage-controlled oscillator circuit. The method may also include operatively connecting a feedback divider circuit with the voltage-controlled oscillator circuit.

One or more of the following features may be included. In some embodiments, the phase-locked loop circuit may include a dual-path PLL having an integral path and a proportional path. The phase-locked loop circuit may include a single-path PLL. The loop filter circuit may be configured to suppress high-frequency components and transform a phase frequency detector output into the control signal. The voltage-controlled oscillator circuit may use an external voltage to influence its frequency of operation. The feedback divider circuit may divide a voltage-controlled oscillator frequency and generate a feedback signal to the phase frequency detector circuit. The feedback signal may include a waveform having a frequency lower than that of a voltage-controlled oscillator circuit output signal. The switched capacitor resistor may be located in the proportional path. The circuit may include an RC filter circuit operatively connected with the switched capacitor resistor in the proportional path. The circuit may further include a complementary switched capacitor resistor in electrical communication with the switched capacitor resistor.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 5 shows a table of data points consistent with embodiments of the present disclosure;

FIG. 7 is a table showing parameter data consistent with embodiments of the present disclosure;

Figure 12:
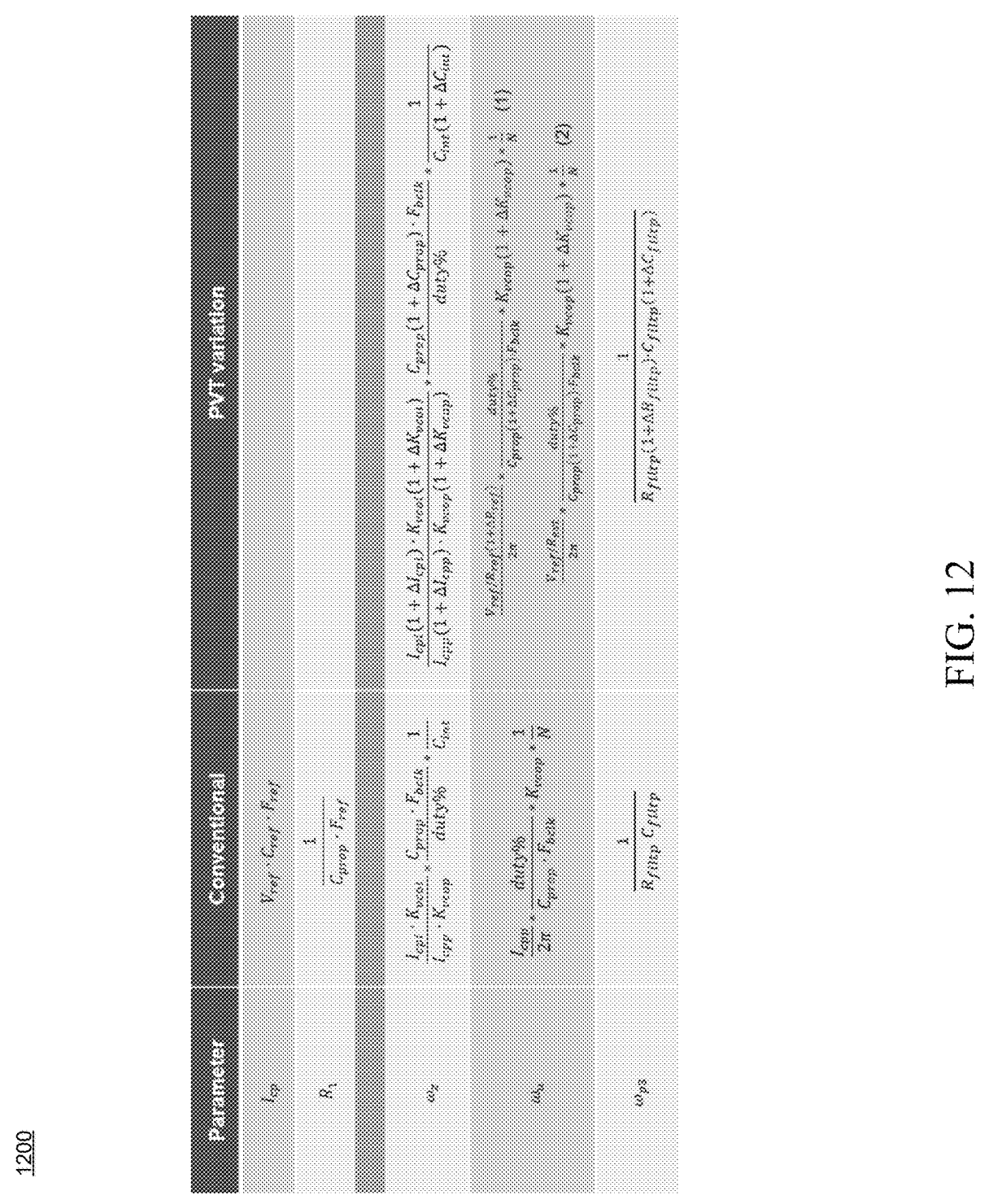

FIGS. 10-13 show tables showing parameter data consistent with embodiments of the present disclosure; and FIG. 14 shows a flowchart depicting operations consistent with embodiments of the present disclosure.

DETAILED DESCRIPTION

Figure 1:
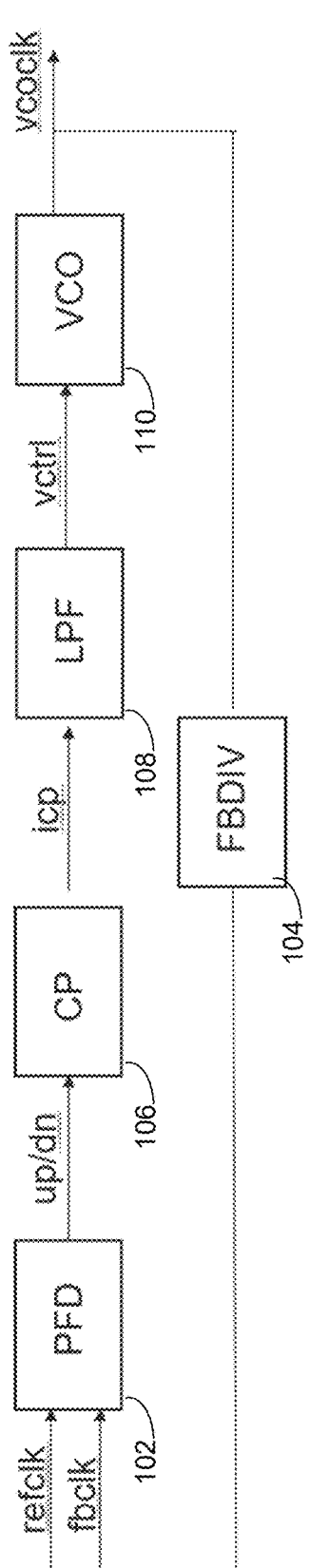
FIG. 1 is an example block diagram of a phase-locked loop architecture consistent with embodiments of the present disclosure.

Embodiments of the present disclosure are directed toward phase-locked loop (PLL) systems having reduced bandwidth variation. In conventional implementations, the rule of thumb is to have minimum PLL phase margin of 60 degrees to reduce ringing in the system, where phase margin is a measure of a closed loop control system's stability. Further, to comply with the 60 degrees minimum guideline for the PLL phase margin in systems with large bandwidth variation, the phase margin may need to be set much higher than 60 degrees, which in turn may require a design trade-off of PLL area and jitter performance. To meet the phase margin requirements over Process, Voltage and Temperature (PVT), the PLL loop parameters may need to be designed with a large margin. This may come with a tremendous area and power penalty, and that may create a problem for universal chiplet interconnect express (UCIe) applications that target lower-power values and smaller areas. Once identified, the phase margin variation may be primarily due to the variation in the open-loop unity gain bandwidth of the PLL ($\omega_u$) gets either too close to zero-frequency ($\omega_z$) or too close to the $3^{rd}$ pole frequency ($\omega_{p3}$). The method described herein seeks to greatly reduce the variation of $\omega_u$. Furthermore, variation of $\omega_u$ may also lead to: loop stability problems; suboptimal jitter performance in cases where the bandwidth is optimized for low jitter; violation of Gardner's stability limit such that loop analysis methods using continuous time approximation will not hold thereby generating more stability related issues (F. M. Gardner, Charge Pump Phase Lock Loops, November 1980); and non-compliance with the strict restrictions on PLL bandwidth and peaking limits required by communication standards such as peripheral component interconnect express (PCIe).

The method described herein may be based on providing a switched-capacitor bias generation to both a proportional and an integral PLL charge pump to minimize $\omega_u$ variation over PVT in such a way that the phase margin and other PLL loop characteristics may be less severely impacted.

In a conventional implementation, the PLL may have the bias current used at the charge pump generated from either a HiR-based biasing block or an external trimmed resistor-based current. In either case, the variation on the resistor corner (HiR-based current), or the capacitor corner (Rext-based current) changes the $\omega_u$ of the PLL, such that the PLL transfer characteristics may also keep changing, which may generally be considered an undesirable outcome.

Instead, the method described herein may be used to generate a switched-capacitor based current to both charge pumps, such that the resistor-capacitor (RC) variation over process, voltage, and temperature (PVT) is mathematically nullified. If both the switched-capacitor based current in bias generation and the switched-capacitor based current in proportional charge pump are close by, then both of them may have similar process variations. The goal of the method described herein may be to build a PLL system whose $\omega_u$ may be solely dependent on a proportional voltage-controlled oscillator (VCO) gain $K_{vcop}$ such that its variation may be reduced through training.

Referring now to FIG. 1, an example block diagram of phase-locked loop circuitry 100 consistent with embodiments of the present disclosure is provided. PLL circuitry 100 may include a phase-frequency detector (PFD) 102, which may be configured to accept periodic input signals from a reference source and feedback divider (FBDIV) 104. PFD 102 may generate one or more output signals (e.g., "up/dn") that may represent the phase difference between the two inputs. Charge pump circuitry (CP) 106 may source or sink charge for a controlled amount of time based upon the up/dn signal from phase-frequency detector 102. The phase/frequency error information from phase-frequency detector 102 may be translated to the amount of current flowing out of or into charge pump circuitry 106. This current, as used herein, may be defined as $V_{bg} * C_s * F_{ref}$, where $V_{bg}$ is the bandgap voltage, $C_s$ is the capacitor to form a switched-cap resistor, and $F_{ref}$ is the frequency reference source.

In some embodiments, phase-locked loop circuitry 100 may further include loop filter circuitry (LPF) 108, which may be configured to suppress the higher-frequency components and transform the phase detector's output into something that may control a voltage-controlled oscillator (VCO) 110 (shown as signal "vctrl" in FIG. 1). The PLL transfer characteristics or loop dynamic may depend on the design of loop filter circuitry 108. In some embodiments, the proportional resistor ($R_1$) may be formed by $$\frac{1}{F_{bclk} \cdot C_{R1}}$$

in order to cancel the process, voltage, and temperature (PVT) variation, where $F_{bclk}$ is a signal generated by a feedback clock.

In some embodiments, voltage-controlled oscillator 110 may be controlled by the "vctrl" signal. Voltage-controlled oscillator 110 may be a variable-frequency oscillator that allows an external voltage to influence its frequency of oscillation. The output produced after the PLL clock is considered a "clean clock". Feedback divider circuitry 104 may be configured to divide down the VCO frequency and form the feedback loop. Accordingly, the waveform fed back to phase detector circuitry 102 may have a frequency that is lower than that of the output signal generated by voltage-controlled oscillator 110.

In existing systems, the PLL phase margin may vary from 82.5 degrees at room temperature, for the typical supply and process corner (TT) to 62 degrees at the worst PVT corner. To meet the phase margin specifications (for example 60 degree guidelines) over PVT, the PLL loop parameters may need to be designed with a large margin, which may come with a tremendous area, power penalty and jitter performance, which in turn may be a problem with some applications that target lower-power values and smaller areas. The phase margin variation may be mainly due to the variation on $\omega_u$ (open-loop unity gain bandwidth) of the PLL. Accordingly, embodiments included herein may help to minimize $\omega_u$ variation over PVT, such that the phase margin is not significantly impacted, which is a measure of close-loop control system's stability.

Figure 2:
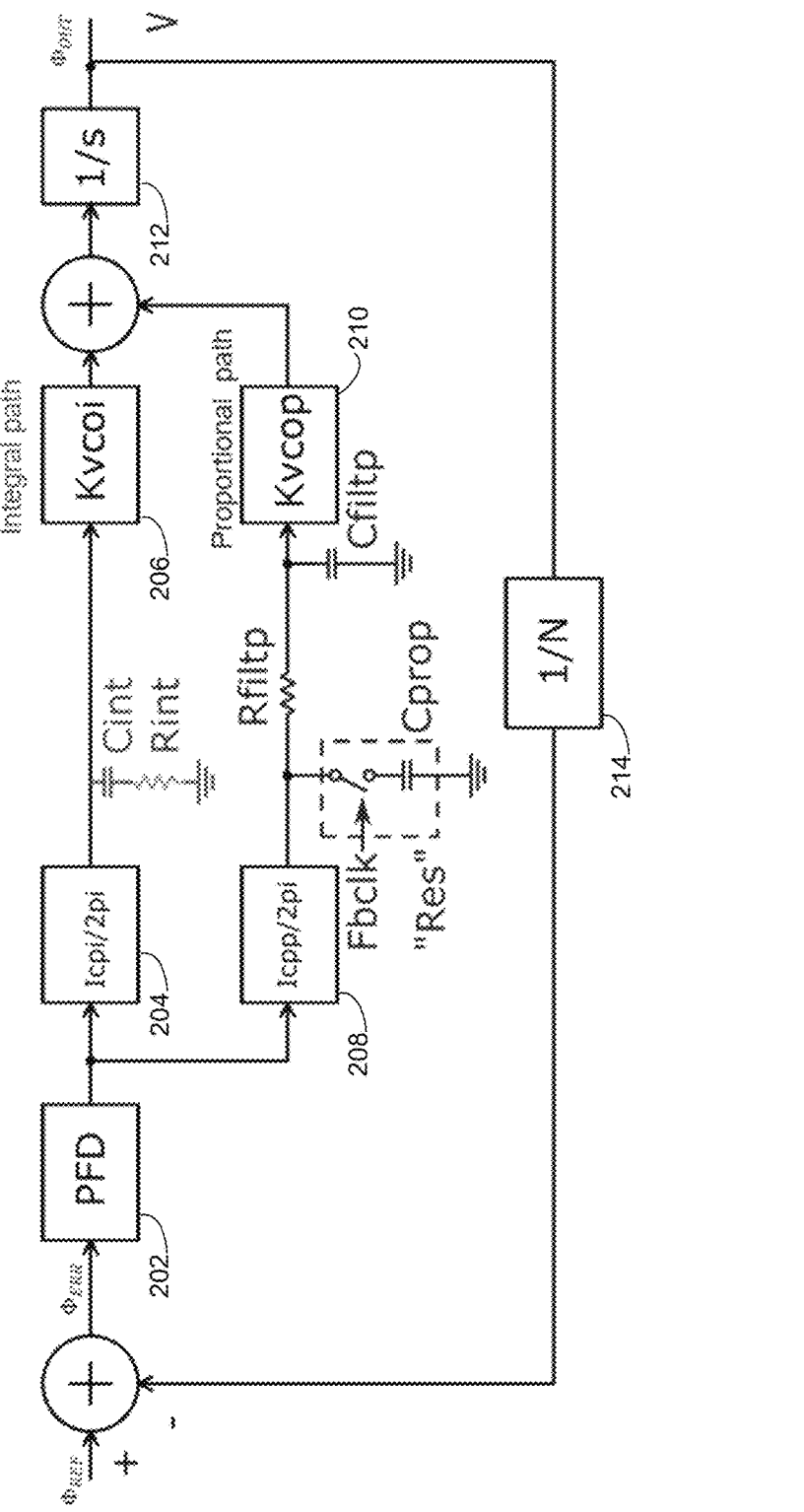
FIG. 2 is an example block diagram of a dual path phase locked loop system consistent with embodiments of the present disclosure.

Referring now to FIG. 2, a diagram depicting a dual-path PLL circuit 200 consistent with embodiments of the present disclosure is provided. PLL circuit 200, may include a PFD 202, which may be configured to accept phase/frequency error information as an input signal. PFD 202 may be connected in parallel to an integral path and a proportional path. The integral path may include integral CP circuitry 204 and integral VCO circuitry 206, while the proportional path may include proportional CP circuitry 208 and proportional VCO circuitry 210. PLL circuit 200 may further include a first block 212 connected in series to PFD 202 and a second block 214 connected in parallel to PFD 202. First block 212 may represent an integration on VCO frequency to phase, where the transfer function of VCO may be Kvcoi/s and Kvcop/s, and second block 212 may represent the transfer function of the feedback divider, written in phase domain. Additionally, within PLL circuit 200, $C_{int}$ may denote an integral capacitor, $R_{int}$ may denote a parasitic capacitance associated with $C_{int}$, $I_{cpi}$ may denote an integral charge pump (CP) current, $K_{vcoi}$ may denote an integral voltage-controlled oscillator (VCO) gain, $F_{belk}$ may denote frequency of a feedback clk, $I_{cpp}$ may denote a proportional CP current, $C_{prop}$ may denote a proportional switch capacitor resistor, $R_{filtp}$ in series with $C_{filtp}$ may denote a proportional RC filter, $K_{vcop}$ may denote a proportional VCO gain, and duty % may denote a duty cycle of $F_{belk}$.

$$L(s) = L(s)_{int} + L(s)_{prop}; \qquad \text{Equation 01}$$

$$L(s) = \frac{I_{cpi}}{2\pi}\left(\frac{1}{sC_{int}} + R_{int}\right) \cdot \frac{K_{vcoi}}{s} \cdot \frac{1}{N} + \qquad \text{Equation 02}$$
$$\frac{I_{cpp}}{2\pi}\left(\frac{\text{duty}\%}{F_{fbclk} \cdot C_{prop}}\right) \cdot \left(\frac{1}{1 + sR_{filtp} \cdot C_{filtp}}\right) \cdot \frac{K_{vcop}}{s} \cdot \frac{1}{N};$$

and $$H(s) = \frac{N \cdot L(s)}{1 + L(s)}; \qquad \text{Equation 03}$$

In some embodiments, lower phase margins may be due to the unity gain ($\omega_u$) being too close to the z-frequency ($\omega_z$), because the variation on $\omega_u$ may have a reducing effect on the phase margin. As such $\omega_z$ may represent the zero frequency of the of an open loop and a PLL, while $\omega_{p3}$ may represent the pole frequency of an open loop and a PLL, where both parameters may be important to determine the phase margin of PLL.

Figure 3:
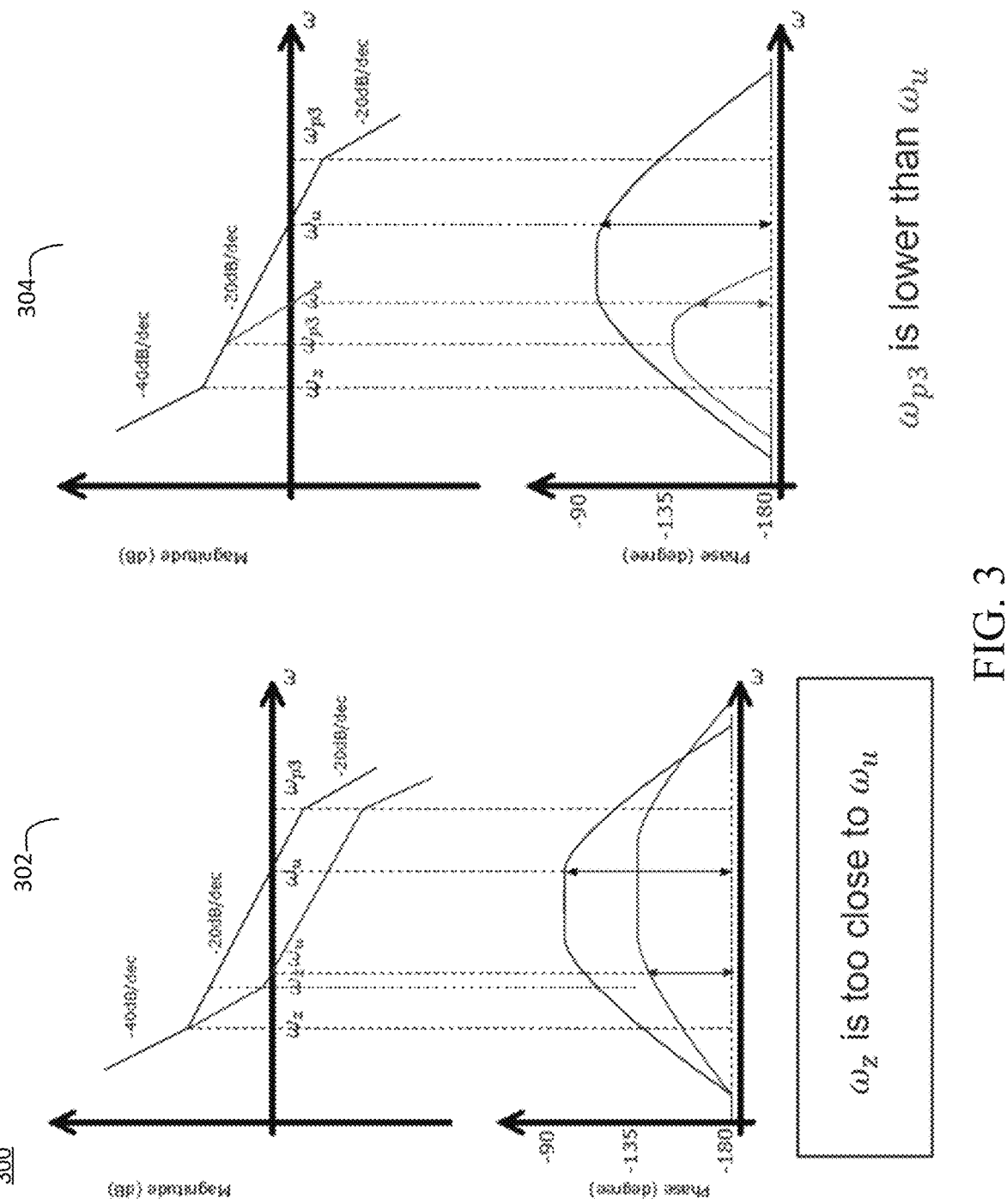
FIG. 3 shows a collection of data plots consistent with embodiments of the present disclosure.

Referring now to FIG. 3, a collection of data plots 300 consistent with embodiments of the present disclosure is provided. The collection of data plots 300 may include a first pair 302 of plots, and a second pair 304 of plots. Both pairs 302, 304 may include idealized plots colored in black, of a transfer function of magnitude vs. frequency and a phase difference of phase vs. frequency. First pair 302 of plots may focus on the difference between the unity gain $\omega_u$ and the z-frequency $\omega_z$, where $\omega_z$ is shown to be in very close proximity to $\omega_u$. This close proximity may greatly reduce the phase-locked loop's (PLL's) phase margin, as shown by the non-idealized plot colored in blue. Second pair 304 of plots may focus on focus on the difference between the unity gain $\omega_u$ and the p3-frequency $\omega_{p3}$, where $\omega_{p3}$ is shown to be less than $\omega_u$ colored in red. This separation between $\omega_u$ and $\omega_{p3}$ may cause less variation in the phase margin as shown by the non-idealized plot colored in red.

Figure 4:
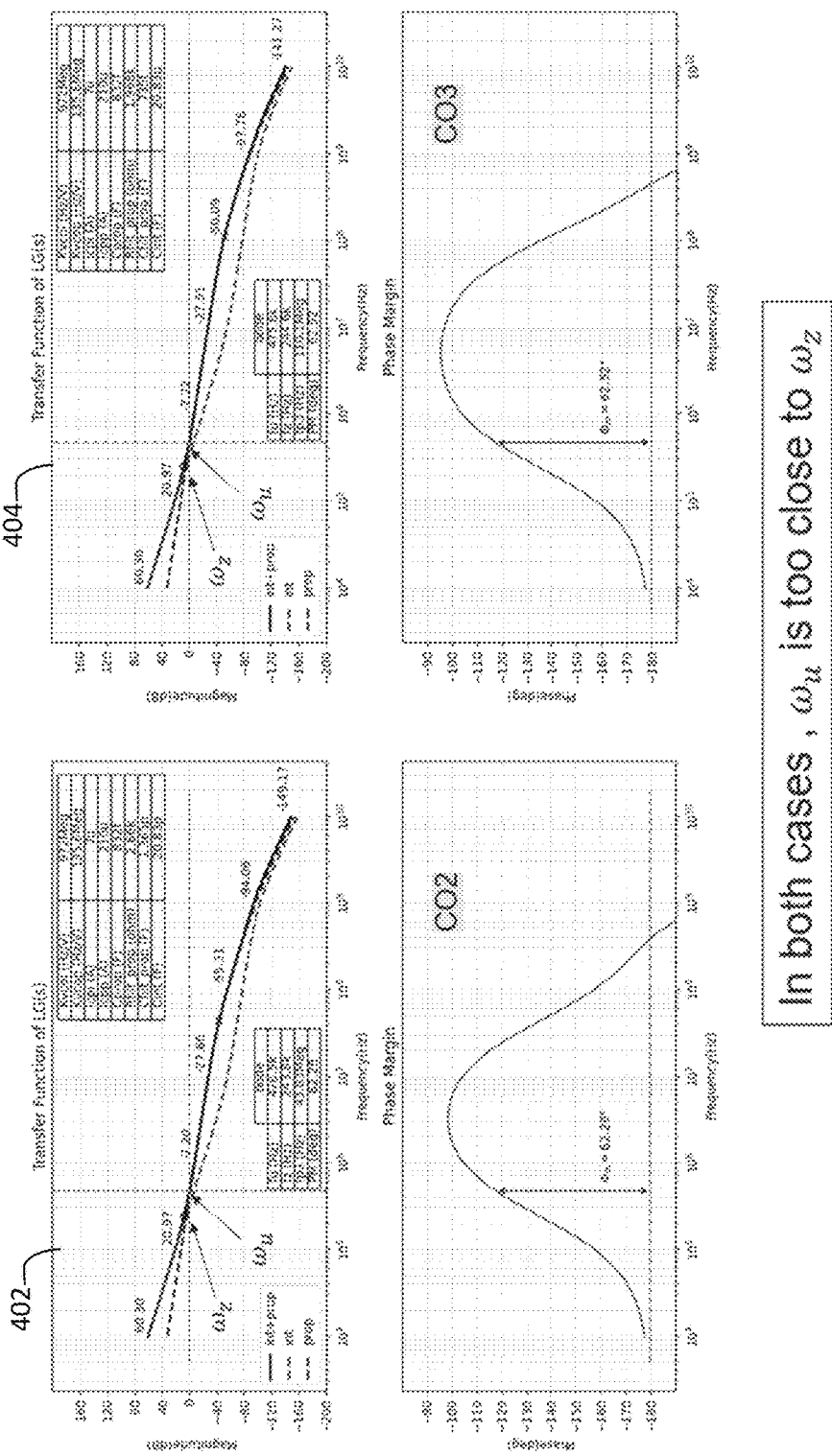
FIG. 4 shows a collection of data plots consistent with embodiments of the present disclosure.

Referring now to FIGS. 4-5, collections of data plots 400, and table 500 consistent with embodiments of the present disclosure are provided. The collection of data plots 400 may include a first pair 402 of plots, and a second pair 404 of plots. In both pairs 402, 404 $\omega_u$ is shown to be in very

6 close proximity to $\omega_z$, such that both pairs of plots show a greatly reduced PLL phase margin. First pair 402 of plots focus on the PVT corner values CO2 represented in table 500, and second pair 404 of plots focus on the PVT corner values CO3 represented in table 500. In both pairs 402, 404 $\omega_u$ may be too close to $\omega_z$, while duty % and $F_{belk}$ may be constants, and the variation of $\omega_u$ may be due to variations in the proportional charge pump (CP) current $I_{cpp}$, the proportional switch capacitor resistor $C_{prop}$, and the proportional voltage-controlled oscillator (VCO) gain $K_{vcop}$.

Figure 6:
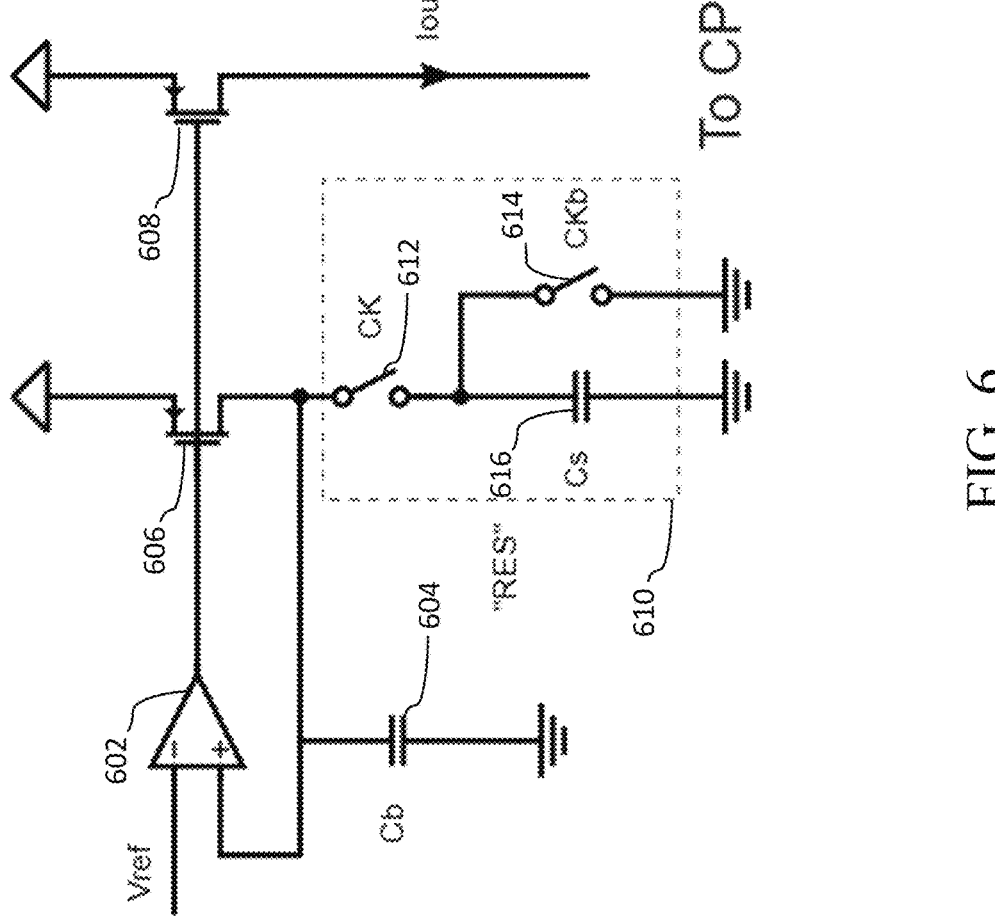
FIG. 6 is an example circuit consistent with embodiments of the present disclosure.

Referring now to FIG. 6 an example circuit 600 consistent with embodiments of the present disclosure is provided. Example circuit 600 may include an operational amplifier (op amp) 602 configured to accept one or more clock signals as input alongside a reference voltage, Vref. Additionally, the one or more clock signals are connected in parallel to a first capacitor 604 configured to shut the high frequency components resulting from switching to ground. Example circuit 600 may also include first transistor 606 and second transistor 608. First transistor 606 may be connected to switched capacitor resistor 610, that may include two non-overlapping clocks 612, 614 respectively. Switched capacitor resistor 610 may also be connected to second capacitor 616 configured to shut the high frequency components resulting from switching within switched capacitor resistor 610 to ground. Second transistor 608 may be connected to a charge pump (not shown). Within example circuit 600, the equation of loop parameters may be given by:

$$\omega_z = \frac{I_{cpi} \cdot K_{vcoi}}{I_{cpp} \cdot K_{vcop}} * \frac{C_{prop} \cdot F_{bclk}}{\text{duty}\%} * \frac{1}{C_{int}}; \qquad \text{Equation 04}$$

$$\omega_u = \frac{I_{cpp}}{2\pi} * \frac{\text{duty}\%}{C_{prop} \cdot F_{bclk}} * K_{vcop} * \frac{1}{N}; \qquad \text{Equation 05}$$

and $$\omega_{p3} = \frac{1}{R_{filtp} \cdot C_{filtp}}; \qquad \text{Equation 06}$$

Where the reference voltage, $V_{ref}$, may be a ratio of bandgap voltage, having a value of 0.45V that may be stable over PVT. While the proportional CP current, $I_{cpp}$, dependency may be cancelled out with $C_{prop}$ leaving the proportional voltage-controlled oscillator (VCO) gain, $K_{vcop}$, as the only variable. In some embodiments, a charge pump current with switched-cap based generation may be given by:

$$I_{cpp} = \frac{V_{ref}}{1/C_s \cdot F_{bclk}} = V_{ref} \cdot C_s \cdot F_{bclk}; \qquad \text{Equation 07}$$

such that, $$\omega_u = \frac{V_{ref} \cdot C_s \cdot F_{bclk}}{2\pi} * \frac{\text{duty}\%}{C_{prop} \cdot F_{bclk}} * K_{vcop} * \frac{1}{N} = \qquad \text{Equation 08}$$
$$\frac{V_{ref} * \text{duty}\% * K_{vcop}}{2\pi N};$$

Referring now to FIG. 7 a table 700 showing parameter data consistent with embodiments of the present disclosure is provided. In conventional PLL circuits generation of the charge pump current ($I_{cp}$) may have an impact on unity gain ($\omega_u$). This impact may be due in part to the higher resistance resistor (HiR) based $I_{cp}$ generation being implemented through a universal chiplet interconnect express (UCIe) application, where HiRs may be made of poly resistor or Titanium Nitride for more advanced technology. As such, the proportional CP current, $I_{cpp}$ may be a function of HiR resistor corner, see Equation 9 below.

$$I_{cpp} = \frac{V_{bg}}{R_{HiR}};$$ Equation 09

Accordingly, the unity gain may be given by Equation 10 below, wherein the variables of influence are marked in bold. ($K_{vcop}$, $C_{prop}$ and $R_{HiR}$)

$$\omega_u = \frac{I_{cpp}}{2\pi} * \frac{duty\%}{C_{prop} \cdot F_{bclk}} * K_{vcop} * \frac{1}{N} =$$ Equation 10

$$\frac{\frac{V_{bg}}{R_{HiR}}}{2\pi} * \frac{duty\%}{C_{prop} \cdot F_{bclk}} * K_{vcop} * \frac{1}{N};$$

In some embodiments, where the external off-chip resistor ($R_{trim}$) may be based to generate $I_{cp}$, the proportional CP current, in such case, $I_{cpp}$ may be a relatively constant over PVT. As such, the proportional CP current, $I_{cpp}$ may be a function of the resistor and bandgap voltage, see Equation 11 below:

$$I_{cpp} = \frac{V_{bg}}{R_{trim}};$$ Equation 11

Accordingly, the unity gain ($\omega_u$) may be given by Equations 12 and 13 below, while the z-frequency and the p3-frequency are given by Equations 14 and 15 respectively, wherein the variables of influence are marked in bold. ($K_{vcop}$, $C_{prop}$)

$$\omega_u = \frac{I_{cpp}}{2\pi} * \frac{duty\%}{C_{prop} \cdot F_{bclk}} * K_{vcop} * \frac{1}{N} =$$ Equation 12

$$\frac{\frac{V_{bg}}{R_{trim}}}{2\pi} * \frac{duty\%}{C_{prop} \cdot F_{bclk}} * K_{vcop} * \frac{1}{N};$$

$$\omega_u = \frac{V_{ref} * duty\% * K_{vcop}}{2\pi N};$$ Equation 13

$$\omega_z = \frac{I_{cpi} \cdot K_{vcoi}}{I_{cpp} \cdot K_{vcop}} * \frac{C_{prop} \cdot F_{blk}}{duty\%} * \frac{1}{C_{int}};$$ Equation 14 and $$\omega_{p3} = \frac{1}{R_{filtp} \cdot C_{filtp}};$$ Equation 15

From these relationships, it may be deduced that the worst-case scenario may occur when $\omega_u$ is too close to $\omega_z$ or too close to $\omega_{p3}$. Better results may be obtained by keeping the unity gain frequency much larger than the zero frequency and keeping unity gain frequency much smaller than p3 frequency, such that for example $0.10\omega_{p3} > \omega_u > 10\omega_z$. It may also be deduced that PVT variation in the unity gain may be reduced by using a switched capacitor resistor-based current and the worst case phase margin may be improved from 62 deg to 72 deg. Equation 13 may show that $K_{vcop}$ is the only remaining variable now, and that variation of the unity gain may also be reduced. Equation 14 may provide relatively stable zero frequency over PVT, because the unwanted variation may be cancelled due to ratio between the $I_{cpi}$ and $I_{cpp}$, $K_{vcoi}$ and $K_{vcop}$, $C_{prop}$ and $C_{int}$, such that the PVTs are independent. Equation 15 may show that variation may remain tolerable so long as the p3-frequency is maintained at a much higher value relative to the unity gain, such that $\omega_{p3} >> \omega_u$ over PVT.

Figure 8:
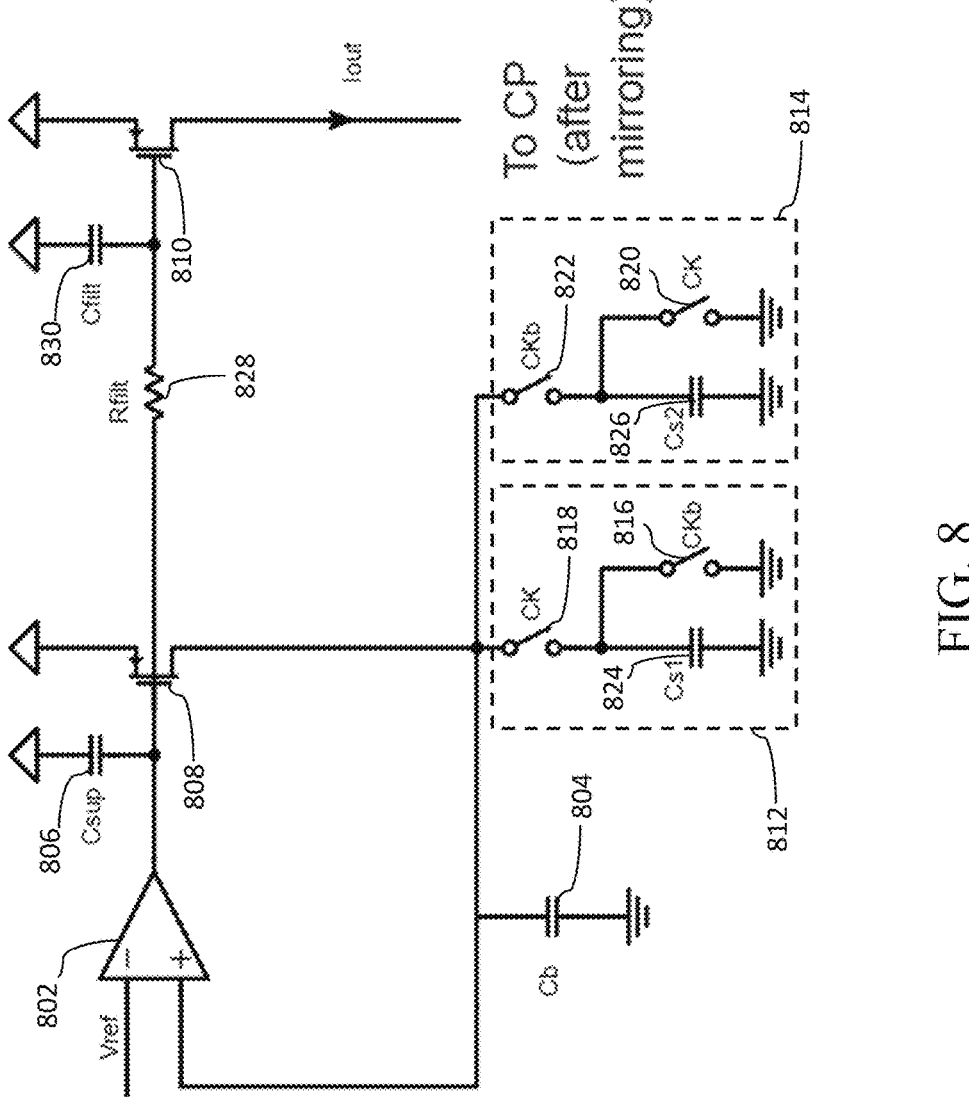
FIG. 8 is an example circuit consistent with embodiments of the present disclosure.
Figure 9:
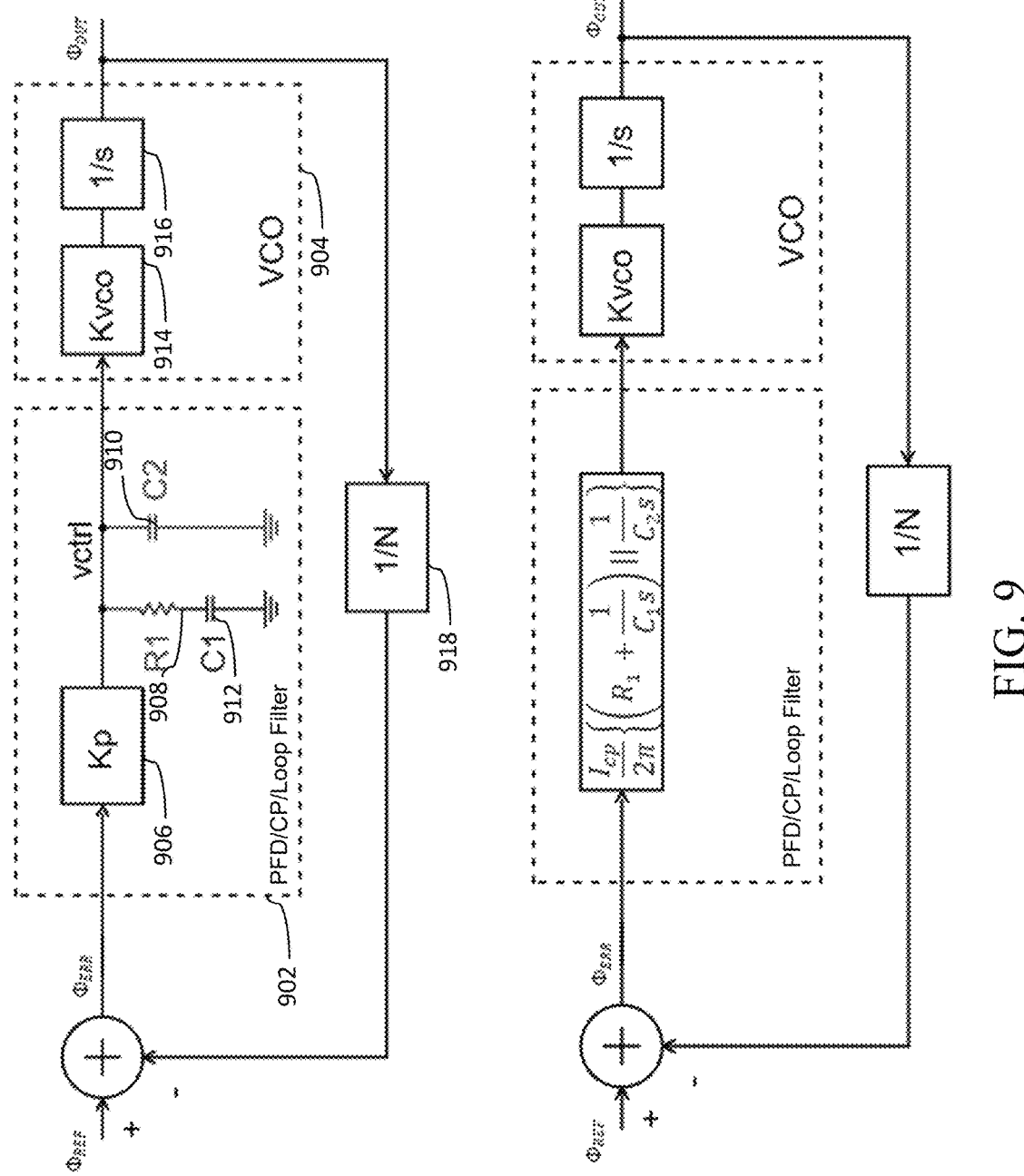
FIG. 9 is an example circuit consistent with embodiments of the present disclosure.

Referring now to FIG. 8 an example circuit 800 consistent with embodiments of the present disclosure is provided. Example circuit 800 may include an operational amplifier (op amp) 802 configured to accept one or more none-overlapping clock signals as input alongside a reference voltage, Vref. Additionally, the one or more clock signals are connected in parallel to a first capacitor 804 configured to shut the high frequency components resulting from switching to ground. Example circuit 800 may also include second capacitor 806, first transistor 808 and second transistor 810, where second capacitor 806 may be configured to shut the output of op-amp 802 to AC ground. First transistor 808 may be connected to two switched capacitor resistors 812, 814 respectively. Both switched capacitor resistors 812, 814 may include two non-overlapping clock signal sources but in reversed order. For example, if first switched capacitor 812 may include non-overlapping clock signal sources 816, 818, where clock signal source 816 is equal to "A" and clock signal source 818 is equal to "B", then second switched capacitor 814 may include non-overlapping clock signal sources 820, 822, where clock signal source 820 is equal to "B" and clock signal source 822 is equal to "A". In this way each switched capacitor resistor is the inverse of the other. Each switched capacitor resistor 812, 814 may also include an internal capacitor configured to shut the high frequency components resulting from switching within the switched capacitor resistor to ground. Specifically, switched capacitor resistor 812, may include internal capacitor 824 and switched capacitor resistor 814 may include internal capacitor 826. Example circuit 800 may also include resistor 828 and third capacitor 830 connected in series to second transistor 810, and second transistor 810 may be connected a charge pump (not shown).

Within example circuit 800 Cb may denote a capacitor used to buffer the high frequency components resulting from switching to ground. CK and CKb may denote two non-overlapping clk switches. The clk switches may not overlap, because overlapping may cause large current spikes. Cs1 and Cs2 may denote two equal value capacitors used to construct the switched capacitor (SC) resistors. In some embodiments two SC resistors may be included in parallel, to cause the switching current to flow in both clock cycles for CK and CKb. Further, the reference current may be doubled, and the effective switching frequency may also be doubled such that the ripple may be more effectively filtered out by the resistor-capacitor (RC) circuit. Additionally, the structure of two SC resistors in parallel may be immune to duty cycle distortion (DCD) of the input clock.

Referring now to FIGS. 9-13 an example circuit 900, and tables 1000, 1100, 1200, and 1300 showing parameter data consistent with embodiments of the present disclosure are provided. Example circuit 900 may include an operational amplifier (op amp) 902 configured to accept one or more clock signals as input alongside a reference voltage, Vref from Bandgap which is relatively constant over PVT. Additionally, the one or more clock signals are connected in parallel to a first capacitor 904 configured to shut the high frequency components resulting from switching to ground. Example circuit 900 may also include second capacitor 906, first transistor 908 and second transistor 910, where second capacitor 906 may be configured to shut the output of op-amp 902 to ground. First transistor 908 may be connected to two switched capacitor resistors 912, 914 respectively. Both switched capacitor resistors 912, 914 may include two non-overlapping clock signal sources but in reversed order. For example, if first switched capacitor 912 may include non-overlapping clock signal sources 916, 918, where clock signal source 916 is equal to "A" and clock signal source 918 is equal to "B", then second switched capacitor 914 may include non-overlapping clock signal sources 920, 922, where clock signal source 920 is equal to "B" and clock signal source 922 is equal to "A". In this way each switched capacitor resistor is the inverse of the other. Each switched capacitor resistor 912, 914 may also include an internal capacitor configured to shut the high frequency components resulting from switching within the switched capacitor resistor to ground. Specifically, switched capacitor resistor 912, may include internal capacitor 924 and switched capacitor resistor 914 may include internal capacitor 926. Example circuit 900 may also include resistor 928 and third capacitor 930 connected in series to second transistor 910, and second transistor 910 may be connected a charge pump (not shown).

Example circuit 900 may include phase-frequency detector (PFD) or a charge pump (CP), and loop filter 902 and voltage-controlled oscillator (VCO) 904. Loop filter 902 may include the gain of the Charge pump, Kp 906, resistor 908 and first capacitor 910 connected in parallel to second capacitor 912, where Kp may be given by $I_{cp}/2_{pi}$, VCO 1004 may include first block Kvco 914, second block 1/s 916. Example circuit 900 may include third block 1/N 918. First block Kvco 914 may represent the frequency gain of VCO in the frequency domain, where 1/s may represent the integration of VCO frequency to phase domain, and 1/N may represent the transfer function of the feedback divider.

Referring now to FIG. 14 a flowchart 1400 depicting operations consistent with embodiments of the present disclosure is provided. According to flowchart 1400, the phase-locked loop (PLL) process may begin by providing 1402 a phase frequency detector circuit configured to receive an input signal, and then receiving 1404 an output signal from the phase frequency detector circuit at a charge pump circuit, where the charge pump circuit sources or sinks may charge for a controlled amount of time-based upon, at least in part, the output signal from the phase frequency detector circuit, where the charge pump circuit may generate a current based upon, at least in part, a bandgap voltage, a switched capacitor resistor, and a frequency reference source. The PLL process may continue by receiving 1406 the current from the charge pump circuit at a loop filter circuit, receiving 1408 the current from the charge pump circuit at a voltage-controlled oscillator circuit, and operatively connecting 1410 a feedback divider circuit with the voltage-controlled oscillator circuit.

It will be apparent to those skilled in the art that various modifications and variations can be made in the embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A phase-locked loop (PLL) circuit comprising:
a phase frequency detector circuit configured to receive an input signal;
a charge pump circuit configured to receive an output signal from the phase frequency detector circuit, wherein the charge pump circuit sources or sinks charge for a controlled amount of time-based upon, at least in part, the output signal from the phase frequency detector circuit, wherein the charge pump circuit generates a current based upon, at least in part, a bandgap voltage, a switched capacitor resistor, and a frequency reference source;
a loop filter circuit configured to receive the current from the charge pump circuit;
a voltage-controlled oscillator circuit configured to receive the current from the charge pump circuit;
a feedback divider circuit operatively connected with the voltage-controlled oscillator circuit; and
a complementary switched capacitor resistor in electrical communication with the switched capacitor resistor, wherein the switched capacitor resistor, the complementary switched capacitor resistor, a first capacitor, and a first transistor are operatively connected a common node.

2. The phase-locked loop circuit of claim 1, wherein the phase-locked loop circuit is a dual path PLL having an integral path and a proportional path.

3. The phase-locked loop circuit of claim 2, wherein the switched capacitor resistor is located in the proportional path.

4. The phase-locked loop circuit of claim 3, further comprises:
an RC filter circuit operatively connected with the switched capacitor resistor in the proportional path.

5. The phase-locked loop circuit of claim 1, wherein the phase-locked loop circuit is a single path PLL.

6. The phase-locked loop circuit of claim 1, wherein the loop filter circuit is configured to suppress high frequency components and transform a phase frequency detector output into the control signal.

7. The phase-locked loop circuit of claim 1, wherein the voltage-controlled oscillator circuit uses an external voltage to influence its frequency of operation.

8. The phase-locked loop circuit of claim 1, wherein the feedback divider circuit divides a voltage-controlled oscillator frequency and generates a feedback signal to the phase frequency detector circuit.

9. The phase-locked loop circuit claim 8, wherein the feedback signal includes a waveform having a frequency lower than that of a voltage-controlled oscillator circuit output signal.

10. A phase-locked loop (PLL) method comprising:
providing a phase frequency detector circuit configured to receive an input signal;
receiving an output signal from the phase frequency detector circuit at a charge pump circuit, wherein the charge pump circuit sources or sinks charge for a controlled amount of time-based upon, at least in part, the output signal from the phase frequency detector circuit, wherein the charge pump circuit generates a current based upon, at least in part, a bandgap voltage, a switched capacitor resistor, and a frequency reference source;
receiving the current from the charge pump circuit at a loop filter circuit;
receiving the current from the charge pump circuit at a voltage-controlled oscillator circuit; and operatively connecting a feedback divider circuit with the voltage-controlled oscillator circuit, wherein a complementary switched capacitor resistor is in electrical communication with the switched capacitor resistor, wherein the switched capacitor resistor, the complementary switched capacitor resistor, a first capacitor, and a first transistor are operatively connected a common node.

11. The phase-locked loop circuit of claim 10, wherein the phase-locked loop circuit is a dual path PLL having an integral path and a proportional path.

12. The phase-locked loop circuit of claim 11, wherein the switched capacitor resistor is located in the proportional path.

13. The phase-locked loop circuit of claim 12, further comprising:

an RC filter circuit operatively connected with the switched capacitor resistor in the proportional path.

14. The phase-locked loop circuit of claim 10, wherein the phase-locked loop circuit is a single path PLL.

15. The phase-locked loop circuit of claim 10, wherein the loop filter circuit is configured to suppress high frequency components and transform a phase frequency detector output into the control signal.

16. The phase-locked loop circuit of claim 10, wherein the voltage-controlled oscillator circuit uses an external voltage to influence its frequency of operation.

17. The phase-locked loop circuit of claim 10, wherein the feedback divider circuit divides a voltage-controlled oscillator frequency and generates a feedback signal to the phase frequency detector circuit.

18. The phase-locked loop circuit claim 17, wherein the feedback signal includes a waveform having a frequency lower than that of a voltage-controlled oscillator circuit output signal.

* * * * *